United States Patent
Colburn et al.

(10) Patent No.: US 7,393,776 B2
(45) Date of Patent: Jul. 1, 2008

(54) METHOD OF FORMING CLOSED AIR GAP INTERCONNECTS AND STRUCTURES FORMED THEREBY

(75) Inventors: Matthew E Colburn, Hopewell Junction, NY (US); Timothy J Dalton, Ridgefield, CT (US); Elbert Huang, Tarrytown, NY (US); Simon M Karecki, deceased, late of Poughkeepsie NY (US); by Anna Karecki, legal representative, Poughkeepsie, NY (US); Satya V Nitta, Poughquag, NY (US); Sampath Purushothaman, Yorktown Heights, NY (US); Katherine L Saenger, Ossining, NY (US); Maheswaran Surendra, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 11/405,287

(22) Filed: Apr. 17, 2006

(65) Prior Publication Data
US 2006/0258147 A1    Nov. 16, 2006

Related U.S. Application Data

(62) Division of application No. 10/666,564, filed on Sep. 19, 2003.

(51) Int. Cl.
H01L 21/4763 (2006.01)
(52) U.S. Cl. .................. 438/619; 438/618; 438/624
(58) Field of Classification Search ........... 438/619, 438/618, 622, 624, 626, 637, 638, 669, 666, 438/668, 672, 977
See application file for complete search history.

(56) References Cited

U.S. PATENT DOCUMENTS

| | | | |
|---|---|---|---|
| 5,461,003 A | 10/1995 | Havemann et al. | 437/187 |
| 5,559,055 A | 9/1996 | Chang et al. | 437/195 |
| 5,869,880 A | 2/1999 | Grill | 257/522 |
| 6,064,118 A | 5/2000 | Sasaki | 257/758 |
| 6,252,290 B1 | 6/2001 | Quek et al. | 257/522 |
| 6,277,705 B1 | 8/2001 | Lee | 438/421 |
| 6,387,797 B1 | 5/2002 | Bothra et al. | 438/619 |
| 6,465,339 B2 | 10/2002 | Brankner et al. | 438/622 |
| 6,661,094 B2 | 12/2003 | Morrow et al. | 257/758 |
| 6,737,725 B2 | 5/2004 | Grill et al. | 257/522 |
| 6,995,073 B2 * | 2/2006 | Liou | 438/421 |
| 2002/0158337 A1 | 10/2002 | Babich et al. | 257/758 |
| 2003/0224591 A1 | 12/2003 | Latchford et al. | 438/619 |

(Continued)

*Primary Examiner*—Kevin M. Picardat
(74) *Attorney, Agent, or Firm*—Ohlandt, Greeley, Ruggiero & Perle, L.L.P.; Daniel P. Morris, Esq.; IBM Corporation

(57) ABSTRACT

A method to form a closed air gap interconnect structure is described. A starting structure made of regions of a permanent support dielectric under the interconnect lines and surrounding interconnect vias with one or more sacrificial dielectrics present in the remaining portions of the interconnect structure, is capped with a dielectric barrier which is perforated using a stencil with a regular array of holes. The sacrificial dielectrics are then extracted through the holes in the dielectric barrier layer such that the interconnect lines are substantially surrounded by air except for the regions of the support dielectric under the lines. The holes in the cap layer are closed off by depositing a second barrier dielectric so that a closed air gap is formed. Several embodiments of this method and the resulting structures are described.

6 Claims, 7 Drawing Sheets

U.S. PATENT DOCUMENTS

| | | |
|---|---|---|
| 2004/0097065 A1 | 5/2004 | Lur et al. .................... 438/619 |
| 2004/0099952 A1 | 5/2004 | Goodner et al. ............. 257/758 |
| 2004/0102031 A1* | 5/2004 | Kloster et al. ............... 438/619 |
| 2004/0127001 A1 | 7/2004 | Colburn et al. .............. 438/586 |
| 2004/0214427 A1 | 10/2004 | Kloster et al. ............... 438/637 |
| 2004/0232552 A1 | 11/2004 | Wang et al. .................. 257/758 |
| 2005/0012219 A1 | 1/2005 | Liou .......................... 257/758 |
| 2005/0079700 A1 | 4/2005 | Schindler et al. ............ 438/618 |
| 2005/0106852 A1* | 5/2005 | Park et al. .................... 438/619 |
| 2005/0202667 A1* | 9/2005 | Cohen et al. ................. 438/622 |

* cited by examiner

METHOD OF FORMING CLOSED AIR GAP INTERCONNECTS AND STRUCTURES FORMED THEREBY

This application is a Divisional of and claims priority from U.S. patent application Ser. No. 10/666,564, filed on Sep. 19, 2003.

BACKGROUND OF THE INVENTION

1. Field of the Invention

The present invention relates to ultra low dielectric constant (ULK) and air gap-containing metal-insulator interconnect structures for Very Large Scale Integrated (VLSI) and Ultra-Large Scale Integrated (ULSI) devices and packaging. More particularly, the present invention relates to structures, methods, and materials relating to the incorporation of ULK materials and air gaps into multiple levels of multilayer interconnect structures.

2. Description of the Prior Art

Device interconnections in Very Large Scale Integrated (VLSI) or Ultra-Large Scale Integrated (ULSI) semiconductor chips typically have multilevel structures containing patterns of metal wiring layers that are encapsulated in an insulator. Wiring structures within a given level of wiring are separated by an intralevel dielectric, whereas the individual wiring levels are separated from each other by layers of an interlevel dielectric. Conductive vias are formed in the interlevel dielectric to provide interlevel contacts between the wiring traces.

Through their effects on signal propagation delays, the materials and layout of these interconnect structures can substantially impact chip speed and thereby chip performance. Signal-propagation delays are due to RC time constants wherein "R" is the resistance of the on-chip wiring, and "C" is the effective capacitance between the signal lines and the surrounding conductors in the multilevel interconnection stack. RC time constants are reduced by lowering the specific resistance of the wiring material and by using interlevel and intralevel dielectrics (ILDs) with lower dielectric constants, k.

A preferred metal/dielectric combination for low RC interconnect structures is copper metal with a dielectric such as $SiO_2$ (k~4.0). Due to difficulties in subtractively patterning copper, copper-containing interconnect structures are typically fabricated by a damascene process. In a typical damascene process, metal patterns that are inset in a layer of dielectric are formed by the steps of: (i) etching holes (for vias) or trenches (for wiring) into the interlevel or intralevel dielectric; (ii) optionally, lining the holes or trenches with one or more adhesion or diffusion barrier layers; (iii) overfilling the holes or trenches with a metal wiring material; and (iv) removing the metal overfill by a planarizing process such as chemical-mechanical polishing (CMP), leaving the metal even with the upper surface of the dielectric.

The above-mentioned processing steps can be repeated until the desired number of wiring and via levels have been fabricated.

Fabrication of interconnect structures by damascene processing can be substantially simplified by using a process variation known as dual damascene (DD), in which patterned cavities for the wiring level and its underlying via level are filled in with metal in the same deposition step. Dual damascene reduces the number of metal polishing steps by a factor of two, providing substantial cost savings, but requires that a dual-relief pattern be introduced into the combined via and wiring level dielectric.

A typical dual damascene process flow by methods of the prior art is shown in FIG. 1.

Examples of multilayer interconnect structures incorporating air gaps are described, for example, in U.S. Pat. No. 5,461,003 (Havemann et al.); U.S. Pat. No. 5,869,880 (Grill et al.); and U.S. Pat. No. 5,559,055 (Chang et al.).

A preferred prior art method for forming air gaps utilizes a sacrificial place-holder (SPH) material which is removed or extracted from beneath a solid or semi-permeable bridge layer. Examples of SPH materials and removal methods include poly (methylmethacrylate) (PMMA), poly-para-xylylene (Parylene™), amorphous carbon, and polystyrene, which may be removed by organic solvents, oxygen ashing, and/or low temperature (~200° C.) oxidation, and norbornene-based materials such as BF Goodrich's Unity Sacrificial Polymer™, which may be removed by moderate temperature (350° C.-400° C.) thermal decomposition into volatiles.

In the case of the Unity material, the volatile decomposition by-product actually diffuses through the bridge layer, as demonstrated by Kohl et al., in Electrochemical and Solid-State Letters, 1, 49 (1998) for structures including partially porous $SiO_2$ (500 nm) bridge layers deposited by a low temperature plasma enhanced chemical vapor deposition (PECVD) process.

However, in all these cases, the removal process, be it by a plasma based or a wet chemical process, or by thermal means, the SPH material or its decomposition or reaction products are required to diffuse through the semi-permeable bridge layer. This is generally very difficult to reduce to practice. If extraction is performed without a bridge layer being present in the structure as a means of bypassing this difficulty of extracting layers through a semi-permeable medium, it would be very difficult to place a bridge layer on top of the extracted structure.

Another concern with air gap based dielectric structures compared to structures with solid dielectrics is that air-gap based structures have lower thermal conductivity, reduced strength, and higher permeability to moisture and oxygen. Accordingly, any workable scheme for incorporating air gaps into interconnect structures must take these limitations into account.

A further concern with air gap dielectrics is that they leave metal wiring features more susceptible to the opens and shorts induced by electromigration-driven mass transport, since the wiring features are no longer physically constrained by being embedded in a solid dielectric.

Still another concern is that structures with air gaps may not be as uniformly planar as structures built with intrinsically more rigid solid dielectrics. This can be a problem if locally depressed areas are formed by bridge layer sag over unsupported air gaps, because the metal filling these depressed areas will remain in the structure after chemical-mechanical polishing (CMP) of the upper levels and be a source of shorts and/or extra and stray capacitance.

Finally, a majority of the prior art methods leave behind a substantial amount of solid dielectric material either under the lines or on the entire via level as a means of providing a mechanical support under the lines to prevent the lines from sagging. However, this increases the capacitance of the structure and diminishes the performance.

In view of the drawbacks mentioned herein above with the prior art processes, there is a continued need for developing a new and improved method in which air gaps can be formed in an interconnect without exhibiting any of the above-mentioned problems.

SUMMARY OF THE INVENTION

It is thus a general object of the present invention to provide a multilayer interconnect structure containing air gaps.

It is a further object of the present invention to provide a scheme wherein the air gap is formed by extracting the SPH material through a partially open bridge layer.

It is yet another object of this invention to provide a scheme wherein a solid bridge layer is transformed into a partially open bridge layer by means of a post processing technique.

Another object of the present invention is to seal the partially open bridge layer after the extraction of the SPH by means of a planarizing dielectric deposition.

It is a further object of the present invention to provide an air gap-containing interconnect structure which is resistant to electromigration failure and environmental corrosion.

Another object of the present invention is to provide an air gap-containing interconnect structure which maximizes air gap volume fraction (relative to total volume fraction of dielectric), while minimizing the amount of unsupported wiring thus increasing the performance.

Another object of the present invention is to provide a method for forming an air gap-containing interconnect structure which minimizes the number of extra processing steps associated with (i) extraction of the sacrificial place-holder (SPH) material; and (ii) forming and/or patterning and/or pinching-off bridge layers through which the SPH must be removed.

Accordingly, the present invention provides a closed air gap interconnect structure, which includes at least two conductive interconnect lines separated by an air gap, wherein at least one of said lines is connected to at least one conducting via, wherein said lines are supported underneath by a plurality of regions made of a robust support dielectric and capped on top by a cap layer.

In a first embodiment the closed air gap interconnect structure includes: a substrate; a first sacrificial dielectric coated on the substrate, the first coated sacrificial dielectric having therein a patterned set of support regions formed by lithography and filled and planarized with a robust line support dielectric, the first sacrificial dielectric having therein contact via holes patterned by reactive ion etching; a second sacrificial dielectric coated on the first sacrificial dielectric and the filled and planarized support regions, the second sacrificial dielectric having lithographically patterned line trenches; a conductive material filled into the line trenches and the via holes and planarized; and a stencil with a regular array of holes on the filled line trenches and the second sacrificial dielectric; wherein the first and second sacrificial dielectrics have been extracted to form air gaps and the regular array of holes have been closed off by depositing a cap dielectric thereby forming the closed air gap interconnect structure.

In a second embodiment, the closed air gap interconnect structure includes a substrate; a first sacrificial dielectric coated on the substrate, the first coated sacrificial dielectric having therein a patterned set of support regions formed by lithography and filled and planarized with a robust line support dielectric, the first sacrificial dielectric having therein contact via holes patterned by reactive ion etching; a second sacrificial dielectric and an optional hard mask layer disposed on the second sacrificial dielectric; the second sacrificial dielectric and the hard mask having lithographically patterned line trenches; a conductive material filled into the line trenches and the via holes and planarized such that top of the filled conductive material is substantially coplanar with the top surface of the optional hard mask; an optional first dielectric cap layer disposed on the hard mask layer; and a stencil with a regular array of holes on top of the cap layer, wherein the regular array of holes have been transferred into the first cap layer and the hard mask layer by a reactive ion etch process; wherein the first and second sacrificial dielectrics have been extracted to form air gaps and a second dielectric cap has been deposited to pinch off the tops of the regular array of holes in the first cap layer thereby closing off the regular array of holes forming the closed air gap interconnect structure.

In the third embodiment, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric and an optional hard mask layer disposed on the second sacrificial dielectric coated on the first sacrificial dielectric, the second sacrificial dielectric and the hard mask having lithographically patterned line trenches; an optional thin conformal dielectric passivation liner layer deposited on the contact via holes and the line trenches; a conductive material filled into the line trenches and the via holes and planarized such that top of the filled conductive material is substantially coplanar with the top surface of the hard mask; an optional first dielectric cap layer disposed on the hard mask layer; and a stencil with a regular array of holes on top of the first cap layer, wherein the regular array of holes have been transferred into the cap layer and the hard mask layer by a reactive ion etch process; wherein the first and second sacrificial dielectrics have been extracted to form air gaps and an optional second dielectric cap has been deposited to pinch off the tops of the regular array of holes in the first cap layer thereby closing off the regular array of holes forming the closed air gap interconnect structure.

In the fourth embodiment, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric coated on the first sacrificial dielectric and the filled and planarized support regions, the second sacrificial dielectric having lithographically patterned line trenches; a conductive material filled into the line trenches and the via holes and planarized; an optional conductive material cap disposed on top surfaces of the conductive material filled into the trenches; and a stencil with a regular array of holes on the line trenches and the second sacrificial dielectric and the optional conductive material cap; wherein the first and second sacrificial dielectrics have been extracted to form air gaps and the regular array of holes have been closed off by depositing a cap dielectric thereby forming the closed air gap interconnect structure.

In the fifth embodiment, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric; an optional hard mask layer disposed on the second sacrificial dielectric coated on the first sacrificial dielectric, the second sacrificial dielectric and the hard mask having lithographically patterned line trenches; a conductive material filled into the line trenches and the via holes and planarized such that top of the filled conductive material is substantially coplanar with the top surface of the hard mask; an optional conductive material cap disposed on top surfaces of the conductive material filled into the trenches; an optional first dielectric cap layer disposed on the hard mask layer and the conductive material cap; and a stencil with a regular array of holes on top of the first dielectric cap layer, wherein the regular array of holes have been transferred into the first dielectric layer and the hard mask layer by a reactive ion etch process; wherein the first and second sacrificial dielectrics have been extracted to form air gaps and a second dielectric cap has been deposited to pinch off the tops of the regular array of holes in the first cap layer thereby closing off the regular array of holes forming the closed air gap interconnect structure.

In the sixth embodiment, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric and an optional hard mask layer disposed on the second sacrificial dielectric coated on the first sacrificial dielectric, the second sacrificial dielectric and the hard mask having lithographically patterned line trenches; a thin conformal dielectric passivation liner layer deposited on the contact via holes and the line trenches; a conductive material filled into the line trenches and the via holes and planarized such that top of the filled conductive material is substantially coplanar with the top surface of the hard mask; and an optional conductive material cap disposed on top surfaces of the conductive material filled into the trenches; an optional first dielectric cap layer disposed on the hard mask layer and the conductive material cap; and a stencil with a regular array of holes disposed on top of the first dielectric cap layer, wherein the regular array of holes have been transferred into the first dielectric layer and the hard mask layer by a reactive ion etch process; wherein the first and second sacrificial dielectrics have been extracted to form air gaps and a second dielectric cap has been deposited to pinch off the tops of the regular array of holes in the first cap layer thereby closing off the regular array of holes forming the closed air gap interconnect structure.

The present invention further provides a method of building a closed air gap interconnect structure including the steps of: coating a first sacrificial dielectric on a substrate and patterning a set of support regions therein; filling and planarizing the support regions with a robust dielectric; coating a second sacrificial dielectric and an optional hard mask layer; patterning line trenches and contact via holes in the structure by lithography and reactive ion etching; depositing an optional thin conformal dielectric passivation liner layer; filling the line trenches and contact via holes with a conductive liner and conductive fill materials and planarizing them so that top of the fill is substantially coplanar with the top surface of the optional hard mask; depositing a first dielectric cap layer and forming a stencil with a regular array of holes on top of the cap layer; transferring the regular array of holes into the cap and the hard mask layers by a reactive ion etch process and extracting the first and second sacrificial dielectrics to form air gaps; and closing off the air gaps by depositing a second dielectric barrier to pinch off the tops of the regular array of holes in the first cap layer.

In another embodiment, the method includes the steps of: coating a first sacrificial dielectric on a substrate and patterning a set of support regions therein; filling and planarizing the support regions with a robust dielectric; coating a second sacrificial dielectric and a hard mask layer; patterning line trenches and contact via holes in the structure by lithography and reactive ion etching; depositing an optional thin conformal dielectric passivation liner layer; filling the line trenches and contact via holes with a conductive liner and conductive fill materials and planarizing them so that top of the fill is substantially coplanar with the top surface of the hard mask; forming an optional electrically conductive cap layer on the tops of the conductive fill material features only; forming a stencil with a regular array of holes on top of the cap layer and the hard mask layer; transferring the regular array of holes into the hard mask layer by a reactive ion etch process and extracting the first and second sacrificial dielectrics to form air gaps; and closing off the air gaps by depositing a dielectric barrier to pinch off the tops of the regular array of holes in the hard mask layer.

In still another embodiment, the method includes the steps of: coating a robust support dielectric on a substrate and a sacrificial dielectric on the support dielectric; coating an optional hard mask layer on top of the sacrificial dielectric; lithographically patterning the optional hard mask and etching line trenches and vias into the sacrificial dielectric and the support dielectric respectively; lining the line trenches and vias with a conductive barrier; filling them with a conductive fill material; planarizing to form interconnect lines and vias such that the top of the fill is substantially coplanar with the top surface of the optional hard mask; depositing a first dielectric barrier cap layer on top of the interconnect lines and optional hard mask; forming a stencil with an array of holes on top of the first dielectric cap layer; transferring the hole pattern into the first dielectric cap and the optional hard mask layers by reactive ion etching; and extracting the sacrificial dielectric and closing off the hole array by depositing a second dielectric barrier layer to form a closed air gap structure.

These and other aspects of the present inventive method and the resulting structures would be apparent from the detailed description of the invention and the illustrative figures that follow.

DETAILED DESCRIPTION OF THE INVENTION

Figure 1A:
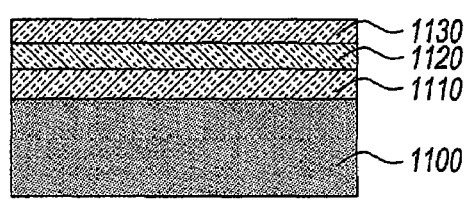
FIGS. 1a-1g describe a typical dual damascene process flow according to the methods of the prior art.
Figure 1B:
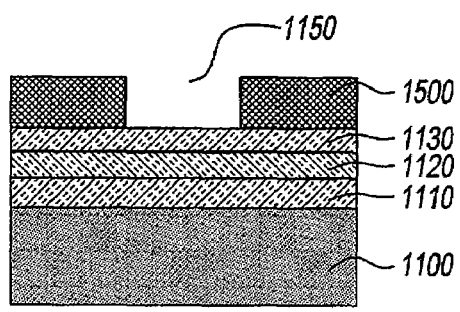
Figure 1C:
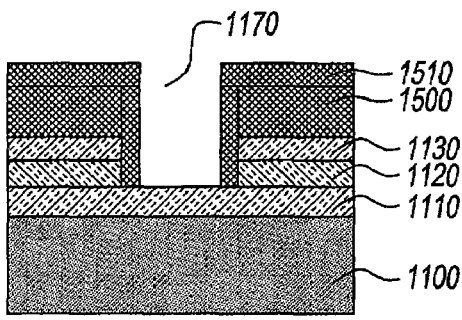

The present invention provides a closed air gap interconnect structure, which includes at least two conductive interconnect lines separated by an air gap, wherein at least one of said lines is connected to at least one conducting via, wherein said lines are supported underneath by a plurality of regions made of a robust support dielectric and capped on top by a cap layer.

The conductive interconnect and the conductive via include a conductive liner and a conductive fill material and the regions of robust support dielectric form an array of pillars.

The regions of robust support dielectric form support beams that lie below the interconnect lines and encase at least one of the conducting via. Alternatively, regions of robust support dielectric form a support plate that lies below the interconnect lines and encase at least one of the conducting via.

Preferably, the cap layer is a dielectric barrier including a regular array of holes, which are closed off with same or different dielectric barrier material.

In the first embodiment of the interconnect structure, the stencil with holes stays in place, holes are closed off by a cap dielectric. The structure has no hard mask or conformal dielectric passivation. The closed air gap interconnect structure includes: a substrate; a first sacrificial dielectric coated on the substrate, the first coated sacrificial dielectric having therein a patterned set of support regions formed by lithography and filled and planarized with a robust line support dielectric, the first sacrificial dielectric having therein contact via holes patterned by reactive ion etching; a second sacrificial dielectric coated on the first sacrificial dielectric and the filled and planarized support regions, the second sacrificial dielectric having lithographically patterned line trenches; a conductive material filled into the line trenches and the via holes and planarized; and a stencil with a regular array of holes on the filled line trenches and the second sacrificial dielectric; wherein the first and second sacrificial dielectrics have been extracted to form air gaps and the regular array of holes have been closed off by depositing a cap dielectric thereby forming the closed air gap interconnect structure.

In the second embodiment, the interconnect structure has the elements of the first embodiment but also has a hard mask, an optional first cap, with the holes being transferred from stencil into first cap and hard mask, a deposited pinch off cap, but no conformal passivation dielectric. Thus, the closed air gap interconnect structure includes a substrate; a first sacrificial dielectric coated on the substrate, the first coated sacrificial dielectric having therein a patterned set of support regions formed by lithography and filled and planarized with a robust line support dielectric, the first sacrificial dielectric having therein contact via holes patterned by reactive ion etching; a second sacrificial dielectric and an optional hard mask layer disposed on the second sacrificial dielectric; the second sacrificial dielectric and the hard mask having lithographically patterned line trenches; a conductive material filled into the line trenches and the via holes and planarized such that top of the filled conductive material is substantially coplanar with the top surface of the optional hard mask; an optional first dielectric cap layer disposed on the hard mask layer; and a stencil with a regular array of holes on top of the cap layer, wherein the regular array of holes have been transferred into the first cap layer and the hard mask layer by a reactive ion etch process; wherein the first and second sacrificial dielectrics have been extracted to form air gaps and a second dielectric cap has been deposited to pinch off the tops of the regular array of holes in the first cap layer thereby closing off the regular array of holes forming the closed air gap interconnect structure.

In the third embodiment, the interconnect structure has the elements of the second embodiment but also has a conformal passivation layer. Thus, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric and an optional hard mask layer disposed on the second sacrificial dielectric coated on the first sacrificial dielectric, the second sacrificial dielectric and the hard mask having lithographically patterned line trenches; an optional thin conformal dielectric passivation liner layer deposited on the contact via holes and the line trenches; a conductive material filled into the line trenches and the via holes and planarized such that top of the filled conductive material is substantially coplanar with the top surface of the hard mask; an optional first dielectric cap layer disposed on the hard mask layer; and a stencil with a regular array of holes on top of the first cap layer, wherein the regular array of holes have been transferred into the cap layer and the hard mask layer by a reactive ion etch process; wherein the first and second sacrificial dielectrics have been extracted to form air gaps and an optional second dielectric cap has been deposited to pinch off the tops of the regular array of holes in the first cap layer thereby closing off the regular array of holes forming the closed air gap interconnect structure.

In the fourth embodiment of the interconnect structure, the stencil with holes stays in place and the structure has a selective metal cap. The holes are closed off by a cap dielectric. The structure has no hard mask or conformal dielectric passivation. The closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric coated on the first sacrificial dielectric and the filled and planarized support regions, the second sacrificial dielectric having lithographically patterned line trenches; a conductive material filled into the line trenches and the via holes and planarized; an optional conductive material cap disposed on top surfaces of the conductive material filled into the trenches; and a stencil with a regular array of holes on the line trenches and the second sacrificial dielectric and the optional conductive material cap; wherein the first and second sacrificial dielectrics have been extracted to form air gaps and the regular array of holes have been closed off by depositing a cap dielectric thereby forming the closed air gap interconnect structure.

In the fifth embodiment, the interconnect structure has the elements of the fourth embodiment but also has a hard mask, first dielectric cap with holes transferred from stencil, a deposited pinch off cap, but no conformal passivation dielectric. Thus, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric; an optional hard mask layer disposed on the second sacrificial dielectric coated on the first sacrificial dielectric, the second sacrificial dielectric and the hard mask having lithographically patterned line trenches; a conductive material filled into the line trenches and the via holes and planarized such that top of the filled conductive material is substantially coplanar with the top surface of the hard mask; an optional conductive material cap disposed on top surfaces of the conductive material filled into the trenches; an optional first dielectric cap layer disposed on the hard mask layer and the conductive material cap; and a stencil with a regular array of holes on top of the first dielectric cap layer, wherein the regular array of holes have been transferred into the first dielectric layer and the hard mask layer by a reactive ion etch process; wherein the first and second sacrificial dielectrics have been extracted to form air gaps and a second dielectric cap has been deposited to pinch off the tops of the regular array of holes in the first cap layer thereby closing off the regular array of holes forming the closed air gap interconnect structure.

In the sixth embodiment, the interconnect structure has the elements of the fifth embodiment but also has a conformal passivation layer. Thus, the closed air gap interconnect structure includes a substrate; a first sacrificial dielectric coated on the substrate, the first coated sacrificial dielectric having therein a patterned set of support regions by lithography and filled and planarized with a robust line support dielectric, the first sacrificial dielectric having therein contact via holes patterned by reactive ion etching; a second sacrificial dielectric and an optional hard mask layer disposed on the second sacrificial dielectric coated on the first sacrificial dielectric, the second sacrificial dielectric and the hard mask having lithographically patterned line trenches; a thin conformal dielectric passivation liner layer deposited on the contact via holes and the line trenches; a conductive material filled into the line trenches and the via holes and planarized such that top of the filled conductive material is substantially coplanar with the top surface of the hard mask; and an optional conductive material cap disposed on top surfaces of the conductive material filled into the trenches; an optional first dielectric cap layer disposed on the hard mask layer and the conductive material cap; and a stencil with a regular array of holes disposed on top of the first dielectric cap layer, wherein the regular array of holes have been transferred into the first dielectric layer and the hard mask layer by a reactive ion etch process; wherein the first and second sacrificial dielectrics have been extracted to form air gaps and a second dielectric cap has been deposited to pinch off the tops of the regular array of holes in the first cap layer thereby closing off the regular array of holes forming the closed air gap interconnect structure.

The present invention further provides a method of building a closed air gap interconnect structure. In a preferred embodiment, the method includes the steps of:

coating a first sacrificial dielectric on a substrate and patterning a set of support regions therein;

filling and planarizing the support regions with a robust dielectric;

coating a second sacrificial dielectric and an optional hard mask layer;

patterning line trenches and contact via holes in the structure by lithography and reactive ion etching;

depositing an optional thin conformal dielectric passivation liner layer;

filling the line trenches and contact via holes with a conductive liner and conductive fill materials and planarizing them so that top of the fill is substantially coplanar with the top surface of the optional hard mask;

depositing a first dielectric cap layer and forming a stencil with a regular array of holes on top of the cap layer;

transferring the regular array of holes into the cap and the hard mask layers by a reactive ion etch process and extracting the first and second sacrificial dielectrics to form air gaps; and closing off the air gaps by depositing a second dielectric barrier to pinch off the tops of the regular array of holes in the first cap layer.

Preferably, the substrate is a microelectronic chip or a chip carrier.

The first sacrificial dielectric can be an organic materials such as poly (methylmethacrylate) (PMMA), poly-para-xylylene, amorphous carbon, poly arylene ethers, polystyrene, polynorbornenes; organosilicate materials such as dense or porous methyl silsesquioxanes, hydrogen silsesquioxanes and mixtures thereof; or an amorphous hydrogenated silicon containing chemical vapor deposited films of the general composition including Si, C, H, and O.

Preferably, the support regions are dielectric pillars or dielectric beams.

The first robust dielectric is a chemically different polymer from the first sacrificial dielectric and can be a polyarylene ether, polyimide, poly-para-xylylene, an organosilicate material, a dense or porous methyl silsesquioxane, hydrogen silsesquioxane, amorphous hydrogenated silicon chemical vapor deposited film of a composition including Si, C, H and O, silicon oxide or a mixture thereof.

The second sacrificial dielectric preferably is an organic material, such as, a poly (methylmethacrylate) (PMMA), poly-para-xylylene, amorphous carbon, poly arylene ether, polystyrene, polynorbornene, an organosilicate material, a dense or porous methyl silsesquioxane, hydrogen silsesquioxane, amorphous hydrogenated silicon chemical vapor deposited film of a composition including Si, C, H and O or a mixture thereof.

The optional hard mask can be an amorphous hydrogenated film of silicon oxide, silicon nitride, silicon carbide, silicon carbonitride, silicon oxycarbide, tantalum nitride, spin on silsesquioxane glass film or a combination thereof.

The conductive liner preferably is Ta, W, Ti, a conductive nitride, a siliconitride thereof or a combination thereof. The conductive fill can be Cu, Ag, Au, Al, W or a combination thereof.

The optional thin conformal dielectric liner layer is typically a spin-on film of methyl silsesquioxane or hydrogen silsesquioxane, a CVD deposited film can be $SiO_2$ and amorphous hydrogenated silicon carbide, or a film having a composition including Si, C, O, and H. The dielectric cap layer can be amorphous hydrogenated silicon carbide, nitrided silicon carbide or silicon nitride.

The stencil with holes can be formed by an electron, X-ray, EUV, ion or photon lithography, imprint lithography, self-assembly processes, spinoidal decomposition or by phase separation of a polymer blend, a copolymer or a composite.

The first and second sacrificial dielectrics is preferably extracted by a method, such as, wet etching, plasma etching, reactive ion etching, thermal means, pyrolysis, supercritical fluid based extraction or a combination thereof.

The second dielectric barrier layer is preferably an amorphous hydrogenated film, such as, silicon oxide, silicon nitride, silicon carbide, silicon carbonitride, silicon oxycarbide or a combination thereof.

In another preferred embodiment, the method includes the steps of:

coating a first sacrificial dielectric on a substrate and patterning a set of support regions therein;

filling and planarizing the support regions with a robust dielectric;

coating a second sacrificial dielectric and a hard mask layer;

patterning line trenches and contact via holes in the structure by lithography and reactive ion etching;

depositing an optional thin conformal dielectric passivation liner layer;

filling the line trenches and contact via holes with a conductive liner and conductive fill materials and planarizing them so that top of the fill is substantially coplanar with the top surface of the hard mask;

forming an optional electrically conductive cap layer on the tops of the conductive fill material features only;

forming a stencil with a regular array of holes on top of the cap layer and the hard mask layer;

transferring the regular array of holes into the hard mask layer by a reactive ion etch process and extracting the first and second sacrificial dielectrics to form air gaps; and closing off the air gaps by depositing a dielectric barrier to pinch off the tops of the regular array of holes in the hard mask layer.

The optional electrically conductive barrier cap layer can be Ta, TaN, W, WN, Ti, TiN, TiSiN, TaSiN, Co—P, Co—W—P, Co—Sn—P and a combination thereof and the optional electrically conductive cap layer can be formed selectively on the tops of the conductive fill material by a process, such as, sputtering, evaporation, chemical vapor deposition, atomic layer deposition, electroless plating, electrolytic plating, chemical mechanical polishing, etching or a combination thereof.

In still another preferred embodiment, the method includes the steps of:

coating a robust support dielectric on a substrate and a sacrificial dielectric on the support dielectric;

coating an optional hard mask layer on top of the sacrificial dielectric;

lithographically patterning the optional hard mask and etching line trenches and vias into the sacrificial dielectric and the support dielectric respectively;

lining the line trenches and vias with a conductive barrier;

filling them with a conductive fill material;

planarizing to form interconnect lines and vias such that the top of the fill is substantially coplanar with the top surface of the optional hard mask;

depositing a first dielectric barrier cap layer on top of the interconnect lines and optional hard mask;

forming a stencil with an array of holes on top of the first dielectric cap layer;

transferring the hole pattern into the first dielectric cap and the optional hard mask layers by reactive ion etching; and extracting the sacrificial dielectric and closing off the hole array by depositing a second dielectric barrier layer to form a closed air gap structure.

If building a multilevel air gap structure is desired, any of the steps of the above-described processes can be repeated at least once.

FIG. 1 shows a typical dual damascene (DD) process flow according to the methods of the prior art.

An inter-metal dielectric (IMD), shown as two layers 1110 and 1120, is coated on the substrate 1100, FIG. 1a. The via level dielectric 1110 and the line level dielectric 1120 are shown separately for clarity of the process flow description. In general, these two layers can be made of the same or different insulating films and in the former case applied as a single monolithic layer. A hard mask layer or a layered stack 1130 is optionally employed to facilitate etch selectivity and to serve as a polish stop. The hard mask stack is selected from amorphous hydrogenated films of silicon oxide, silicon nitride, silicon carbide, silicon carbonitride and silicon oxycarbide; tantalum nitride; spin on silsesquioxane glass films and combinations thereof.

The wiring interconnect network consists of two types of features: line features that traverse a distance across the chip, and the via features which connect lines in different levels of interconnects in a multilevel stack together. Historically, both layers are made from an inorganic glass like silicon dioxide ($SiO_2$) or a fluorinated silica glass (FSG) film deposited by plasma enhanced chemical vapor deposition (PECVD).

In the dual damascene process, the position of the lines 1150 and the vias 1170 are defined lithographically in photoresist layers 1500 and 1510 respectively (FIGS. 1b and 1c) and transferred into the hard mask and IMD layers using reactive ion etching processes. The process sequence shown in FIG. 1 is called a "line-first" approach.

Figure 1D:
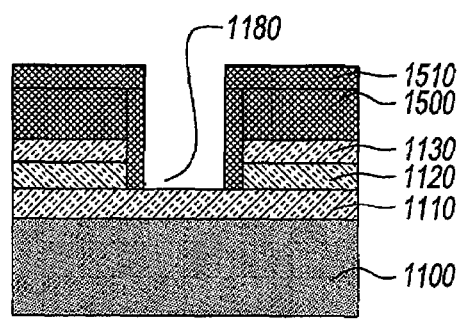

After the trench formation, lithography is again used to define a via pattern 1170 in the photoresist layer 1510 and the pattern is transferred into the dielectric material to generate a via opening 1180 (FIG. 1d).

Figure 1E:
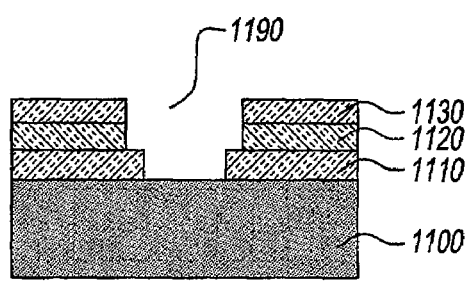
Figure 1F:
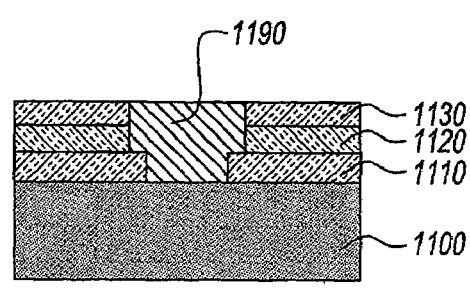

The dual damascene trench and via structure 1190 is shown in FIG. 1e after the photoresist has been stripped. This recessed structure 1190 is then coated with a conducting liner material or material stack 1200 that serves to protect the conductor metal lines and vias and serve as an adhesion layer between the conductor and the IMD. This recess is then filled with a conducting fill material 1210 over the surface of the patterned substrate. The fill is most commonly accomplished by electroplating of copper although other methods such as chemical vapor deposition (CVD) and other materials such as Al or Au can also be used. The fill and liner materials are then chemical-mechanical polished (CMP) to be coplanar with the surface of the hard mask. The structure at this stage is shown in FIG. 1f.

Figure 1G:
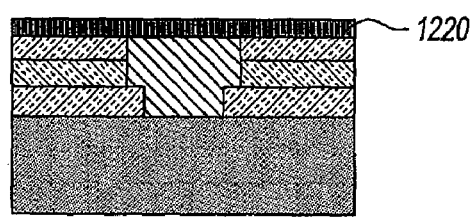

A capping material 1220 is then deposited as a blanket film, as depicted in FIG. 1g, to passivate the exposed metal surface and to serve as a diffusion barrier between the metal and any additional IMD layers to be deposited over them. Typically, silicon nitride, silicon carbide and silicon carbonitride films deposited by PECVD are used as the capping material 1220. This process sequence is repeated for each level of the interconnects on the device. This process is designated a being a dual damascene process because two interconnect features (line and via) are simultaneously defined to form a conductor in-laid within an insulator by a single polish step resulting in a metal in-laid structure.

Low-k alternatives to $SiO_2$ include carbon-based solid materials such as diamond-like carbon (DLC), also known as amorphous hydrogenated carbon (a—C:H), fluorinated DLC (FDLC), SiCO and SICOH compounds, and organic or inorganic polymer dielectrics. Nanoporous versions of $SiO_2$ and the above-mentioned carbon-based materials have even lower k values, while air gaps have the lowest k values of any material (k~1.00). It should be noted that the air gap can include any gaseous material, including air, or it can have a partial or substantially full vacuum.

FIGS. 2a-2h detail the method disclosed by the present invention.

Figure 2A:
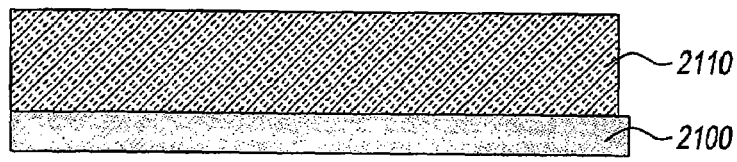
FIGS. 2a-2h describe the process flow for forming supported air gap interconnects with very low effective dielectric constant by the method of the present invention.

Referring to FIG. 2a, a method according to the present invention is shown, which begins with the deposition of a via level dielectric 2110 over substrate 2100 as shown in FIG. 2a.

In a preferred embodiment, the dielectric 2110 is sacrificial in nature. Following this, a lithographic mask is used to etch holes into the via level dielectric (2110) and the holes are then filled with permanent dielectric 2120, also called the line support dielectric.

Figure 2B:
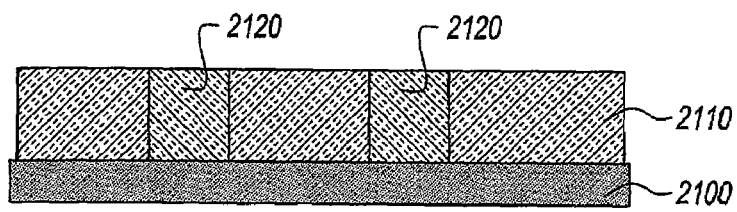

Referring to FIG. 2b, the permanent dielectric (2120) is then planarized in such a fashion that it forms a planar surface with dielectric 2110 as shown in FIG. 2b.

An important feature of this invention is that the lithographic mask used to define the holes of the permanent dielectric 2120 is designed in such a fashion that the permanent dielectric 2120 will align either as pillars or beams under the metal lines that will be subsequently formed and thus provide a mechanical support for holding the lines up through subsequent build processes.

These pillars can either be isolated and placed at appropriate distances apart such that the metal line formed in subsequent steps does not sag, or can be joined together to form a continuous beam on which the metal lines sit. In the case where the pillars are separated and isolated, the total amount of permanent dielectric in the system is reduced, thus resulting in a structure with a very low effective dielectric constant. In either case, it is envisioned that the line support dielectric is defined such that it is wide enough to hold up the subsequently formed metal lines despite any unintentional misalignments that might occur during subsequent lithography steps used to form these metal lines.

The sacrificial via level dielectric can be made of a variety of materials, such as, poly (methylmethacrylate) (PMMA); poly-para-xylylene (Parylene™); amorphous carbon; poly arylene ethers, such as, SiLK™ dielectric from the Dow Chemical company and polystyrene, all of which can be removed by organic solvents, oxygen ashing, and/or low temperature (~200° C.) oxidation; norbornene-based materials, such as, BF Goodrich's Unity Sacrificial Polymer™, which can be removed by moderate temperature (350° C.-400° C.) thermal decomposition into volatiles; dense or porous methyl silsesquioxanes; hydrogen silsesquioxanes, $SiO_2$, amorphous hydrogenated silicon carbides, and CVD deposited films of a general composition including Si, C, O and H, all of which can be removed by means of the appropriate wet or plasma etching methods.

The permanent line support dielectrics have to be carefully chosen because they will remain as permanent features of the structure.

The first constraint on such a choice is the need for this material to be a low dielectric constant (k) material.

A second constraint on this material is that it should be able to fill gaps. Thus, any of the widely available low k materials that can fill gaps can be used as the permanent line support dielectric 2120. It is desirable for this material to have good mechanical properties such as high hardness, a high elastic modulus and good fracture toughness. Thus, the material can be made of dense or porous methyl silsesquioxanes, hydrogen silsesquioxanes, $SiO_2$, amorphous hydrogenated silicon carbides, CVD deposited films of the general composition Si—C—O—H, organic polymers such as polyarylene ethers and polyimides.

A third constraint is that the support dielectric has to be chemically distinct and not be affected by the method used to remove the SPH material.

Figure 2C:
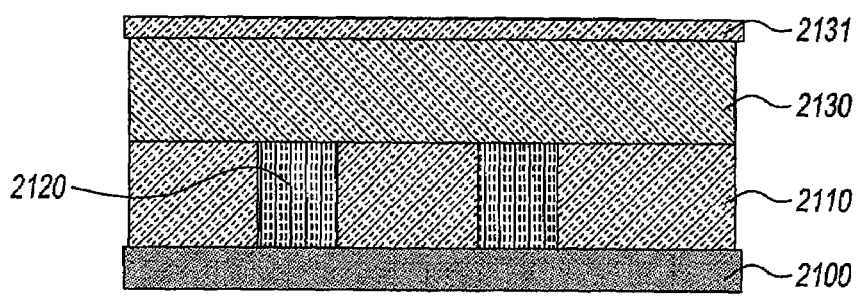

Referring to FIG. 2c, a line level sacrificial dielectric 2130 is then deposited on top of the via level sacrificial dielectric 2110, as shown in FIG. 2c.

The line level sacrificial dielectric 2130 is desirably made from the same material as the via level dielectric 2110.

Next, an optional hard mask layer 2131 can be deposited on top of the line level sacrificial dielectric 2130 for the purpose of pattern definition and transfer through the lithography and etch steps. The hard mask layer can also act as a CMP stop. The hard mask is typically an amorphous hydrogenated film of silicon oxide, silicon nitride, silicon carbide, silicon carbonitride, silicon oxycarbide tantalum nitride and a combination thereof.

Figure 2D:
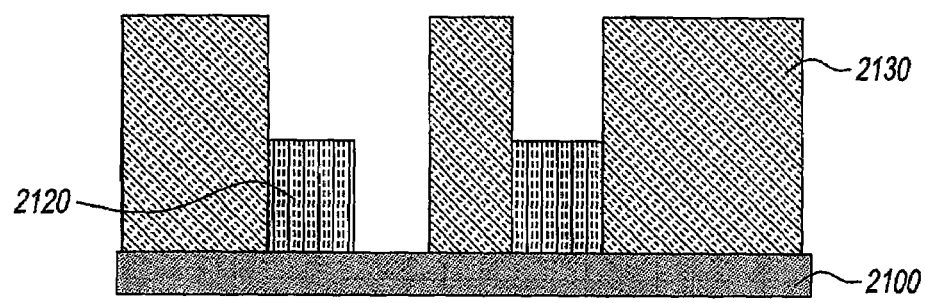

Referring to FIG. 2d, the dual damascene trench and via openings are next formed in the combined dielectric stack. If the line support dielectric 2120 is a beam, then the via etch is performed into the beam. However, if the line support dielectric used is in the form of isolated pillars, the via etch is performed into the via level sacrificial dielectric. FIG. 2d shows the structure at the point where the line and via etch is transferred into the combined dielectric stack.

Next, following an optional wet or dry clean to remove any residues caused by the etch process, the line and via openings are filled with a thin conformal conductive liner by means of either a physical vapor deposition (PVD), atomic layer deposition (ALD) or a chemical vapor deposition (CVD) process.

The purpose of this liner is multifold. First, it acts as a diffusion barrier between the Cu and the permanent dielectric. Second it acts as an enhancer of the electromigration lifetime of the metal layers. Third, it prevents extrusions, during use, of the subsequently deposited metal, which preferably is copper.

The liner is typically made of refractory metals, such as, Ta, Ti or W, or nitrides thereof, such as, TaN, TiN, WN and TaSiN or combinations thereof.

If needed, an optional reinforcing thin and conformal dielectric liner can be deposited prior to the metallic liner deposition. This serves as both an enhancer for electromigration lifetimes as well as a barrier to prevent oxygen and moisture from reaching the metallic layers.

Preferably, the reinforcing dielectric liner has a low dielectric constant and good mechanical, electrical and chemical properties and can be made of one of spin-on films such as methyl silsesquioxanes, hydrogen silsesquioxanes, or CVD deposited films such as $SiO_2$, amorphous hydrogenated silicon carbides, or films with the general composition including Si, C, O and H.

Following the liner deposition, a conductive seed film of copper (Cu) is put down to enhance the electrochemical plating of the copper.

Next, the line trenches and vias defined in the dielectric stack are plated with copper metal in such a fashion that the Cu completely fills the openings. Typically, the copper is overfilled and then planarized back to the dielectric stack surface by means of a Chemical Mechanical polish to define the line, 2140 and the via 2150 layers.

Figure 2E:
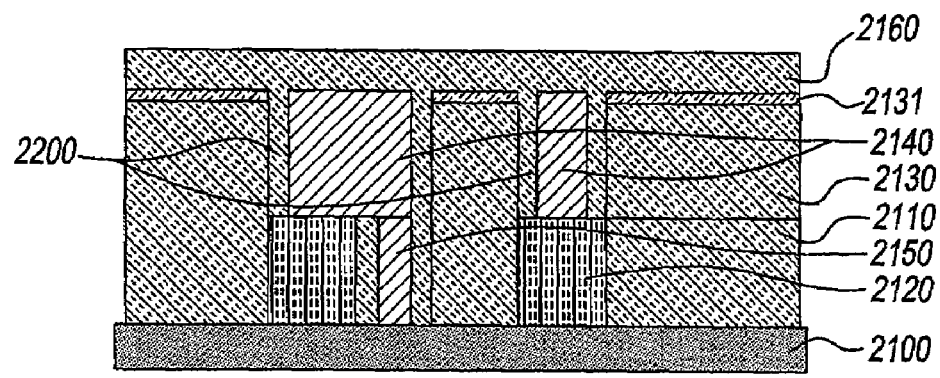

The structure at this point is illustrated in FIG. 2e.

Referring to FIG. 2e, next a dielectric barrier film such as amorphous hydrogenated silicon carbide, nitrided versions of silicon carbide or silicon nitride 2160 are deposited. This layer serves as a diffusion barrier for Cu and also prevents the ingress of oxidizing environments into the copper lines during processing or use. The structure at this point is illustrated in FIG. 2e.

Figure 2F:
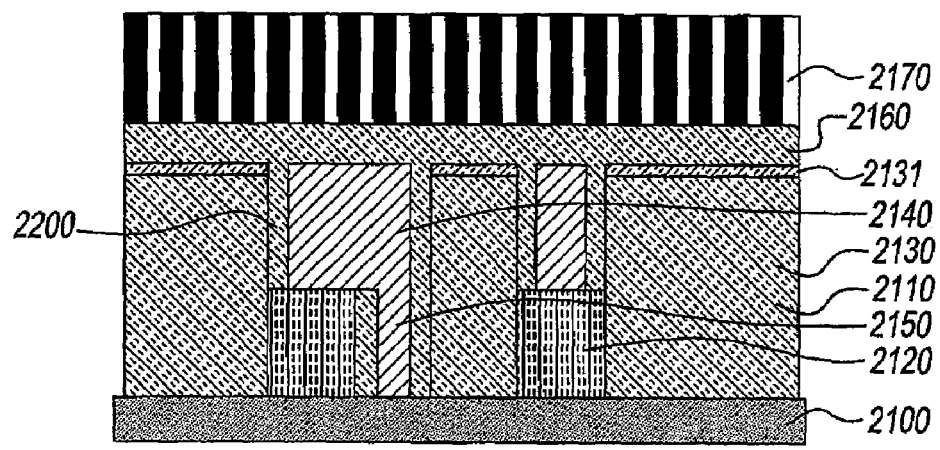

Referring to FIG. 2f, a stencil 2170 with columnar holes is formed over the barrier film to extract the sacrificial dielectrics through the barrier layer and the optional hardmask, as shown in FIG. 2f.

Figure 2G:
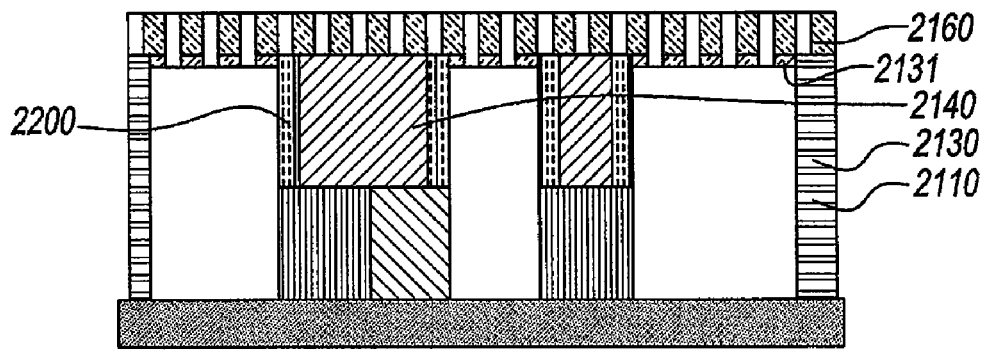

Referring to FIG. 2g, the columnar hole pattern is subsequently transferred through the barrier layer and the optional hard mask using a reactive ion etch (RIE) process and the sacrificial dielectrics 2110 and 2130 are extracted. The stencil 2170 can either be a permanent part of the structure, or be sacrificial, as shown in FIG. 2g.

Stencil with columnar holes can be made out of many possible materials such as $MgF_2$, $SiO_x$ and $CaF2$ through oblique angle deposition (Journal of Vacuum Science and Technology A, 15(4), pp. 2148-2152). As a preferred embodiment, $SiO_x$ (where $1<x<2$) can be used as the material out of which these films can be fabricated. These films can be made with 20-90% porosity with the pores aligned nominally perpendicular to the surface.

The stencil may also be formed in many other ways. In place of the columnar thin films, the patterning of holes can be performed, for example, lithographically, wherein electron, X-rays, EUV, ion or photons can be used. Imprint lithography, soft lithography, self-assembly processes, spinoidal decomposition or phase separation of polymer blends, copolymers, or composites may also be used. Thus, for example, poly (methylmethacrylate)-co-(polystyrene) (referred to as PMMA and PS) or other block copolymer or copolymer blend systems that phase separate may be used to produce a "patterned" structure on the surface of the substrate which can then be used to extract the sacrificial layers 2110 and 2130.

The block copolymer systems produce hexagonal close packed array of PMMA domains in PS upon suitable coating and post baking steps. The PMMA domains can be preferentially etched away using a developing solution of acetic acid to obtain a regular array of vertical holes in PS. The hole array can be transferred to the dielectric barrier and hard mask layers by a RIE process and the PS can then be stripped away by a plasma ashing process.

In order to selectively extract the sacrificial dielectrics 2110 and 2130, a wet chemical based method, a dry plasma based reactive ion etch method, a thermal decomposition, a UV exposure or an e-beam exposure or combinations thereof can be used, the choice depending on the nature of the sacrificial dielectrics 2110 and 2130. Alternately supercritical fluid carbon dioxide with suitable co-solvents and extraction chemicals can be used to dissolve and effectively remove the sacrificial place holder material.

Figure 2H:
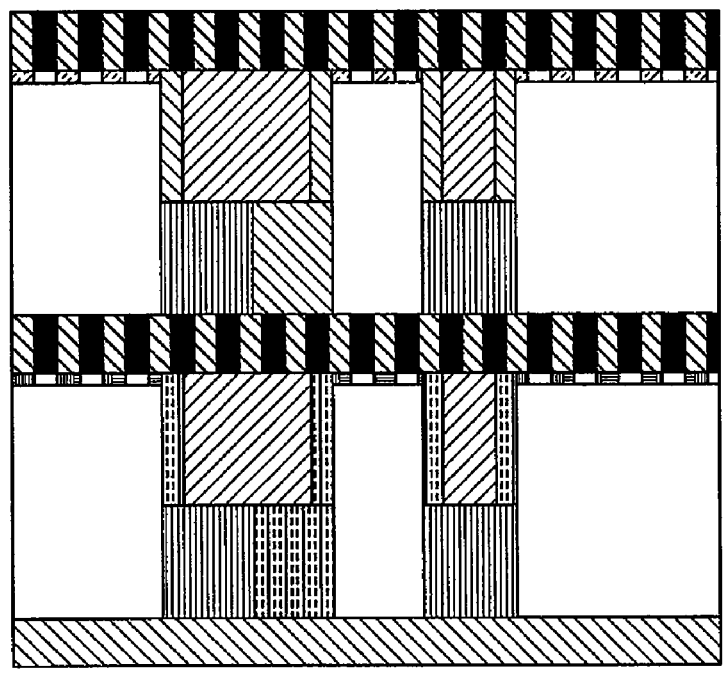

Referring to FIG. 2h, following the extraction of the sacrificial dielectric, the holes in the cap layer are pinched off by a thin non-conformal dielectric barrier film preferably made out of the same material as that of layer 2160 followed by the application of the next level sacrificial dielectric so that the whole process can be repeated to yield a multi-level air gap structure as shown in FIG. 2h.

Figure 3A:
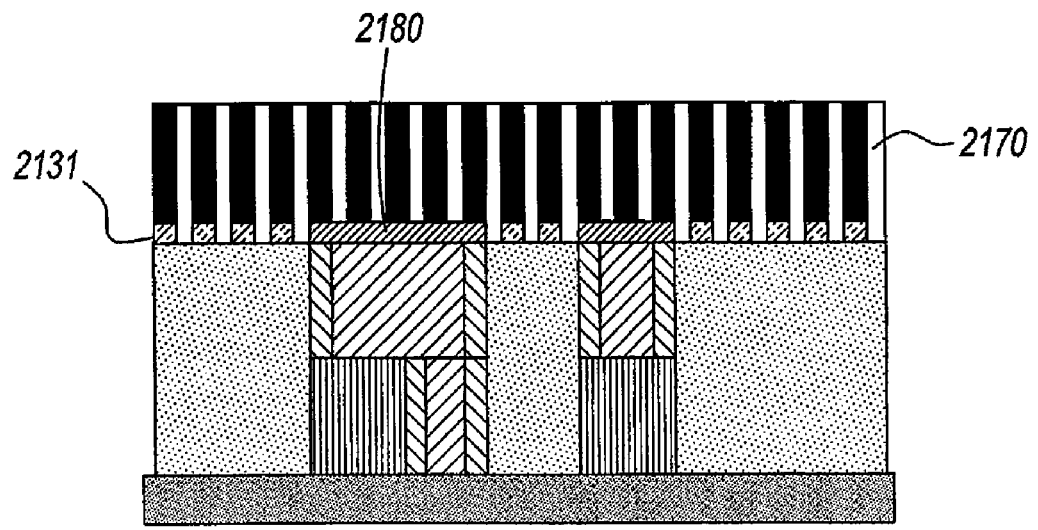
FIGS. 3a-3b describe a structure produced by the method of the present invention including selective metal caps only over the interconnect lines.
Figure 3B:
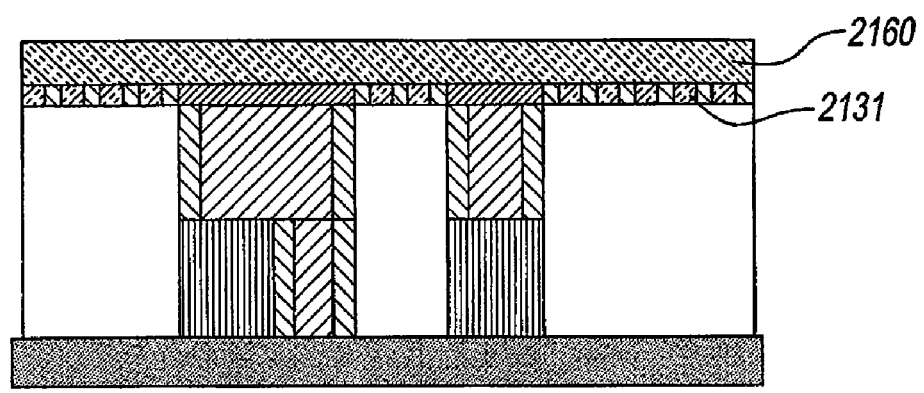

Referring to FIGS. 3a and 3b, in another embodiment of the present invention, instead of the flat barrier 2160, a selective metal cap 2180 is used to cap the copper wire. The stencil film 2170 with columnar holes is formed directly over the selective metal cap and sacrificial dielectric if no hard mask layer is used or over the selective metal cap and the hard mask layer if one is used. The selective metal cap is a conductive barrier layer can be Ta, TaN, W, WN, Ti, TiN, TiSiN, TaSiN, Co—P, Co—W—P, Co—Sn—P and combinations thereof. PVD, CVD, ALD, electroless plating or electrolytic plating coupled with etching and polishing can be used to selectively form the cap only on the copper wire feature surfaces. The sacrificial dielectric can then be extracted at this stage or extracted after a multilevel build is performed through the perforated stencil films present at each level as shown in FIGS. 3a and 3b.

Figure 4A:
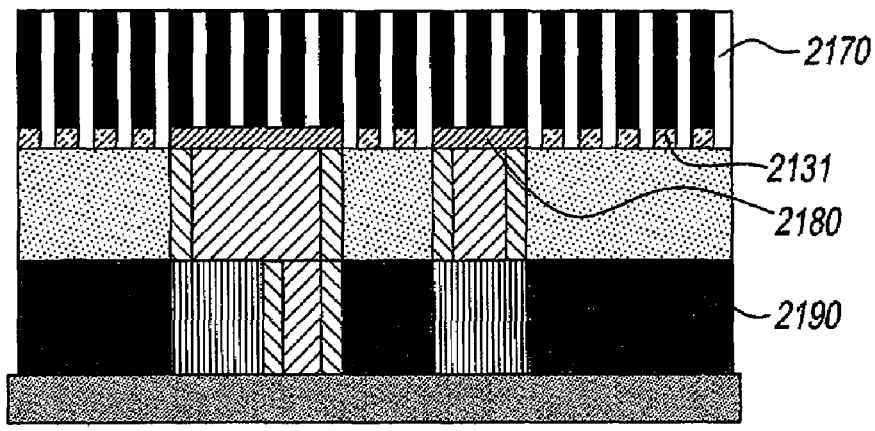
FIGS. 4a-4b show a more robust structure produced by the method of the present invention including an air gap formed only between the lines.
Figure 4B:
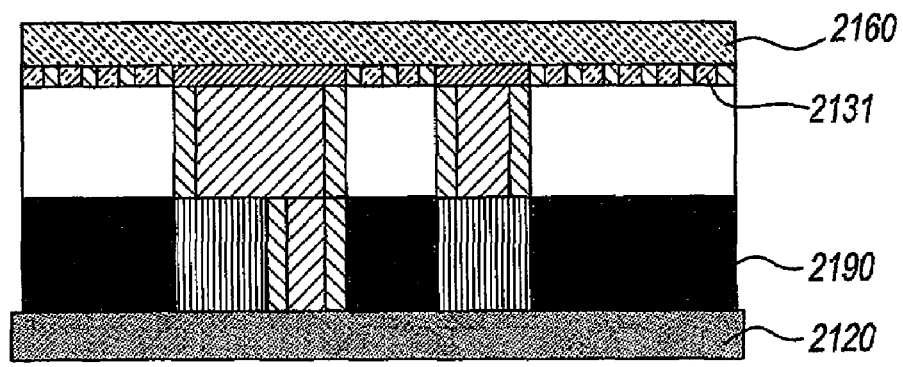

Referring to FIG. 4, in still another embodiment of the present invention, in place of the sacrificial dielectric 2110 and permanent 2120, one permanent dielectric 2190 is used and the sacrificial dielectric 2130 is deposited on top of it. Following this, after the dual damascene build and stencil film 2170 deposition, hole transfer into the barrier layer and hard mask, the sacrificial dielectric 2130 is extracted leaving an air gap only at the line level as shown in FIG. 4.

Such a structure is more robust mechanically than the structure depicted in 2g, but has a higher effective capacitance. This embodiment does not require an additional lithographic step to define a line holder dielectric 2120 and is thus easier to fabricate than the first embodiment.

The permanent dielectric 2190 can be made of the same materials as those used to make the permanent dielectric film 2120.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of building a closed air gap interconnect structure comprising the steps of:
   coating a first sacrificial dielectric on a substrate and patterning a set of discrete support regions formed by lithography therein;
   filling and planarizing said discrete support regions with a robust line support dielectric;
   patterning contact via holes in said first sacrificial dielectric by reactive ion etching;
   coating a second sacrificial dielectric and a hard mask layer on said first sacrificial dielectric and said discrete support regions;
   patterning and etching line trenches in said second sacrificial dielectric and said hard mask layer;
   depositing a thin conformal dielectric passivation liner layer on said contact via holes and said line trenches;
   filling said line trenches and said contact via holes with a conductive liner and conductive fill material and planarizing said conductive fill material so that a top surface of said conductive fill material is substantially coplanar with a top surface of said second sacrificial dielectric;
   forming an electrically conductive cap layer on a top surface of said conductive fill material;
   forming a stencil having a regular array of holes on a top surface of said electrically conductive cap layer and said hard mask layer;
   transferring said regular array of holes into said hard mask layer by reactive ion etching and extracting said first sacrificial dielectric and said second sacrificial dielectric to form air gaps; and
   closing off said air gaps by depositing a dielectric barrier to pinch off a top surface of said regular array of holes in said hard mask layer.

2. A method according to claim 1, wherein said electrically conductive cap layer is selected from the group consisting of: Ta, TaN, W, WN, Ti, TiN, TiSiN, TaSiN, Co-P, Co-W-P, Co-Sn-P and a combination thereof.

3. A method according to claim 1, wherein said electrically conductive cap layer is formed selectively on a top surface of said conductive fill material by a process selected from the group consisting of:
sputtering, evaporation, chemical vapor deposition, atomic layer deposition, electroless plating, electrolytic plating, chemical mechanical polishing, etching and a combination thereof.

4. A method according to claim 1, wherein the steps therein are repeated at least once to build a multilevel air gap structure.

5. A method of forming an air gap structure comprising the steps of:
   coating a robust line support dielectric on a substrate and coating a sacrificial dielectric on said robust line support dielectric;
   coating a hard mask layer on a top surface of said sacrificial dielectric;
   lithographically patterning said hard mask layer and etching line trenches and vias into said sacrificial dielectric and said robust line support dielectric respectively;
   lining said line trenches and said vias with a conductive barrier;
   filling said line trenches and said vias with a conductive fill material;
   planarizing said conductive fill material to form interconnect lines and vias so that a top surface of said conductive fill material is substantially coplanar with a top surface of said hard mask layer;

depositing a first dielectric barrier cap layer on said interconnect lines and said hard mask layer;

forming a stencil having an array of holes on said first dielectric barrier cap layer;

transferring said array of holes into said first dielectric barrier cap layer and said hard mask layer by reactive ion etching; and extracting said sacrificial dielectric and closing off array of holes by depositing a second dielectric barrier layer to form a closed air gap structure.

6. A method according to claim 5, wherein the steps therein are repeated at least once to build a multilevel air gap structure.

* * * * *